United States Patent [19]

Kanada et al.

[11] Patent Number: 4,610,949

[45] Date of Patent: Sep. 9, 1986

[54] METHOD FOR DIRECT PLATE MAKING FROM MULTICOLOR ORIGINAL

[75] Inventors: Eiji Kanada; Kazunaka Endo; Kyonosuke Yamamoto; Shigeyoshi Suzuki, all of Nagaokakyo, Japan

[73] Assignee: Mitsubishi Paper Mills, Ltd., Tokyo, Japan

[21] Appl. No.: 697,569

[22] Filed: Feb. 1, 1985

[30] Foreign Application Priority Data

Feb. 7, 1984 [JP] Japan .................................. 59-21221

[51] Int. Cl.$^4$ ........................... G03F 7/00; G03C 5/00
[52] U.S. Cl. ..................................... 430/301; 430/204; 430/302; 430/356; 430/394; 430/347
[58] Field of Search ............... 430/204, 302, 501, 500, 430/356, 301, 347, 394

[56] References Cited

U.S. PATENT DOCUMENTS

| | | | |
|---|---|---|---|
| 2,332,474 | 10/1943 | Schusterman | 430/501 |
| 3,615,127 | 10/1971 | Land | 430/501 |
| 4,224,402 | 9/1980 | Vermeulen | 430/204 |
| 4,454,216 | 6/1984 | Horii et al. | 430/302 |

FOREIGN PATENT DOCUMENTS 1453098 10/1976 United Kingdom .

*Primary Examiner*—Mary F. Downey
*Attorney, Agent, or Firm*—Cushman, Darby & Cushman

[57] ABSTRACT

Disclosed is a method for the direct making of printing plates for multicolor lithography capable of faithfully reproducing repeatedly continuous gradation multicolor original, which comprises using color separation filters for at least blue, green, and, red and repeating a sequence of the steps of shielding an exposure section against light by a light shielding means; feeding to said exposure section a magazine containing a sensitive material convertible into lithographic printing plate, which material bears a panchromatically sensitized photographic layer; bringing said sensitive material into close contact with a contact screen; exposing said sensitive material through a lens and a color separation filter to the reflected light from a continuous gradation multicolor original; and sending the exposed sensitive material to a processing bath section.

8 Claims, No Drawings

METHOD FOR DIRECT PLATE MAKING FROM MULTICOLOR ORIGINAL

This invention relates to a method of making a lithographic printing plate directly from a finished original, that is, so-called method of direct plate making. More particularly, it relates to a method of direct plate making from a multicolor original.

At present, a variety of sensitive materials convertible to lithographic printing plates are known and are in actual use. As typical examples, there may be mentioned presensitized plates (hereinafter referred to briefly as PS plates) employing diazonium compounds, electrophotographic plates employing zinc oxide or organic conductors, and silver salt photographic plates employing silver halide emulsions. Especially the photosensitive lithographic materials of high sensitivity such as the second and third ones of the above sensitive materials have come into remarkably wide use in the direct making of lithographic printing plates, because such sensitive materials can be treated conveniently and rapidly in an automatic printing plate processor throughout the process beginning with photographing of the original to be printed and including a sequence of processing steps.

Being very high in sensitivity, contrast, and resolving power, the silver salt sensitized material is especially useful. However, although having been imparted with excellent characteristics and improved quality, such sensitized materials are still unsuitable at present for use in the direct making of lithographic printing plates capable of reproducing multicolor prints from a continuous gradation color original such as multicolor photographs. The reasons for this may be many, but one of the most important is a considerably inferior image reproducibility together with an insufficient printing endurance of the directly prepared printing plate as compared with a PS plate. As known well, the PS plate is imparted with a high image-reproducibility through contact printing from an expensive lith film used as an intermediate original, whereas the direct plate making process involves photographing in a camera through a lens, which results in an unsatisfactory image reproducibility. As described in Japanese Patent Application "Kokai" (Laid-open) No. 89,007/73, the process camera includes a prism or a reflection mirror to obtain a laterally corrected image. Such a prism or mirror is known to exert an influence upon optical characteristics, resulting in deterioration of the image reproducibility. Every process camera now in general use photographs a reflected image. Accordingly, the originals to be photographed are so-called reflection images such as characters and lines (these images are referred to as line images) formed on high-contrast image-forming materials employing an opaque support, such as photographic composing paper sheets or positive paper sheets used in the silver complex diffusion transfer process; or other reflection images such as a halftone dot image transformed from a continuous gradation image, e.g., a photograph. A general practice is to arrange the reflection images according to a predetermined design and use as the finished original (block copy).

When a lithographic printing plate is directly made from a silver salt sensitized plate or electrophotographic plate with a reflection halftone dot image used as original, there is reproduced a practically acceptable halftone dot image having a screen ruling of generally 80 or at most 100 lines per inch. Accordingly, even if black and white halftone dot images are prepared by using a panchromatically sensitized continuous gradation film or lith film for color separation and if lithographic printing plates for color printing are prepared by the direct process from said halftone dot images used as original, the resulting printing plates produce a printed color image with unsatisfactory image reproducibility.

Moreover, a panchromatically sensitized film material used in making a color printing plate from a PS plate must be handled in a perfectly dark room, presenting one of the principal factors which adversely affect the working efficiency of the printing plate manufacturer. In addition, an improvement in the printing endurance is also demanded for the lithographic color printing plate.

An object of the present invention is to provide a novel method for the direct making of a lithographic printing plates capable of faithfully reproducing repeatedly the continuous gradation multicolor original.

Another object of the present invention is to provide a method for the direct making of a lithographic printing plate in a daylight room.

The above object of this invention has been achieved by a method for the direct making of lithographic printing plate, which comprises using color separation filters for at least blue, green, and red, and repeating a sequence of the steps of (1) shielding an exposure section against light by a light shielding means;

(2) feeding to said exposure section a magazine containing a sensitive material convertible into lithographic printing plate, which bears a panchromatically sensitized photographic layer;

(3) bringing said sensitive material into close contact with a contact screen;

(4) exposing said sensitive material through a lens and a color separation filter to the reflected light from a continuous gradation multicolor original; and (5) sending the exposed sensitive material to a processing bath section.

The present inventors had carried out an extensive study to improve the image reproducibility of a directly made lithographic printing plate and found that although the unsatisfactory reproducibility originates partly from the optical system such as lens or reflection mirror, yet another important cause is the reflection halftone dot image customarily used as block copy in conventional methods for the direct making of a printing plate. The present inventors already proposed that the image reproducibility can be improved by exposing through a transparent halftone dot image used as the block copy. This technique, however, was not suitable for the direct making of a printing plate from a multicolor original.

As a result of continued study, it was found that even though an optical system such as lens or reflection mirror and a reflection block copy such as a continuous gradation reflection color original are used, it is possible to obtain a printing plate exhibiting a reproducibility favorably comparable to that obtained by use of a PS plate when a sensitive material bearing a panchromatically sensitized photographic layer is brought into close contact with a contact screen and exposed through a color separation filter. The lithographic printing plate thus prepared showed a higher printing endurance, being capable of producing a greater number of copies, as compared with a printing plate made by the conventional method. Thus, the use of a contact screen makes it possible to make directly a printing plate from a multicolor original and brings to perfection the system of automatic plate making in a daylight room.

The sensitive material used in this invention should bear a panchromatically sensitized photographic layer, that is, sensitive to blue, green, and red and no matter what the type of sensitive layer may be; namely, whichever of the silver salt photographic layer, electrophotographic layer, and other sensitive layers may be used. For instance, in the case of a sensitive material developable by the silver complex diffusion transfer process, spectral sensitizing dyes for green, red, and, if necessary, blue, respectively, may be selected from the spectral sensitizing dyes represented by the general formula described in Japanese Patent Application "Kokai" (Laid-open) No. 21,601/78.

The sensitive material in the form of sheet or preferably roll is placed in a magazine. The magazine is used to shield the sensitive material against light. In order that the sensitive material in roll form can be loaded in the magazine under daylight, it is preferable that the outermost portion of the roll be an opaque leader paper or the sensitive material be provided with an antihalation backing having a transmission density of 3 or above, e.g., a backing containing carbon black.

The roll of sensitive material is set in the magazine so that it can rotate freely around a spool which is disposed in the magazine and passes through the hollow core of the roll. After having been loaded with the roll, the magazine is closed with a cover. The structure and shape of the magazine can be freely designed. The sensitive material is fed from the magazine to the exposure section either manually or automatically. The exposed material can be wound back into the magazine. The magazine can be conveyed on a carriage reciprocally to and from the exposure section. The magazine or carriage can be provided with means of feeding the sensitive material, cutting the material, and creating a vacuum (for the purpose of insuring the close contact between the sensitive material and the contact screen in the exposure section), and, in addition, an adhering sheet (which is used in establishing close contact between the sensitive material and the contact screen by vacuum and which can also be used to shield the exposure section against light).

The sensitive material is fed to the exposure section with the sensitive side facing a plate glass (preferably disposed horizontally). The cutting of the sensitive material may be performed either before or after exposure. The said plate glass carries on the upper side a gray contact screen. After shielding the exposure section against light by shielding means such as the said adhering sheet or an automatic shutter, the sensitive material is fed to the section and is brought into close contact with the contact screen. It is preferable to change the screen angle of the contact screen according to yellow, magenta, or cyan plate in a customary manner under daylight. After having been made ready for the exposure, the sensitive material is exposed through an optical system comprising essentially an image reversing mechanism such as a prism or a reflection mirror, a color separation filter for blue, green, or red, and a lens to the reflected or/and transmitted light from a multicolor original in order to print the original on the sensitive material. It is preferable to expose imagewise to a light source placed behind a transmission-type multicolor original.

A color original generally bears continuous gradation multicolor photographs scattered with non-color or color line drawings such as characters and lines. Accordingly, in order to make directly a printing plate from such a block copy under daylight, it is necessary to subject a single plate to stepwise exposures while masking alternately the two types of images in the original. For instance, after exposure to either type of images, the sensitive material is wound back to the magazine, the exposure section is released of the shield against light, and the contact screen is removed (or set in place), or, alternatively, the contact screen is removed (or set in place) while being shielded against light. Such a procedure is carried out preferably with respect to at least one plate color, usually a black plate when line drawings are scattered in a color original.

After exposure, the exposed sensitive material is transferred to a processing section which accomodates developing and, if necessary, stabilizing, fixing, and desentitizing baths. The transfer is performed by means of a carriage.

The procedures described in the foregoing is a fundamental one. It is of course possible to modify the procedure so as to include the procedure for the preparation of a black plate, use of flash exposure, and others.

The present invention makes it possible to produce high-quality multicolor prints which are not realized by conventional methods for the direct making of lithographic printing plates from silver salt photographic materials or electrophotographic materials. According to the present invention, a halftone dot color image of 133 or 150 lines/inch or above is satisfactorily reproduced and, moreover, the printing plate exhibits improved printing endurance. The present method makes it possible to perform the plate making operation under daylight, resulting in remarkable improvement in working efficiency.

EXAMPLE

A gelatino silver chlorobromide emulsion containing 3 mole-% of silver bromide was prepared in a customary manner. The silver halide was 0.4 $\mu$m in average particle diameter. After chemical sensitization, the emulsion was panchromatically sensitized by the addition of dyes No. 1, No. 2, and No. 3 shown below. A stabilizer, hardener, and coating aid were added to prepare a coating solution.

An antihalation coating containing powdered silica of 7 $\mu$m in average particle size, hydroquinone, Phenidone, and carbon black was applied onto a subbed polyester film base, 100 $\mu$m in thickness. The above-mentioned coating solution was coated over the antihalation coating layer (AgNO$_3$ 1.5 g/m$^2$).

Dye No. 1: 90 mg per mole of silver halide.
    Anhydro-2-{2-[3-(3-sulfopropyl)-$\beta$-naphthothiazolin-2-ylidene methyl]butenyl}-3-(sulfopropyl)-$\beta$-naphthothiazolium hydroxide.

Dye No. 2: 700 mg per mole of silver halide.
    Anhydro-5-phenyl-2-{2-[5-phenyl-3-(3-sulfopropyl)-benzoxazolin-2-ylidene methyl]butenyl}-3-(sulfopropyl)benzoxazolium hydroxide.

Dye No. 3: 500 mg per mole of silver halide.
    Anhydro-2-[5-chloro-3-(3-sulfopropyl)benzothiazolin-2-ylidene methyl]-3-(3-sulfopropyl)-$\beta$-naphthothiazolium hydroxide triethylammonium salt.

Onto the resulting emulsion layer, was applied a physical development nuclei coating containing palladium sulfide to prepare a sensitive material. The resulting sensitive material was wound round a hollow cylinder to form a roll. The roll was mounted in a magazine with a spool passing through the hollow cylinder so that the roll may rotate freely. After closing with a cover, there is obtained a simplified cassette which can be mounted or demounted at will.

A daylight automatic processor was constructed, which was provided with an original rack, light source for reflection or transmission exposure, reflection mirror, filter rack, lens rack, plate glass disposed in the exposure section, carriage (provided with a cutter and adhering sheet to shield against light), and processing tanks (developing, fixing, and desensitizing tanks connected through a roller conveyor mechanism).

An original bearing continuous gradation color photographs and scattered letters in black was mounted on the rack. Heading letter A, heading letter B, and text letter C were to be printed in red, green, and black, respectively. Accordingly, yellow, magenta, cyan, and black plates were prepared by exposing in the order and under the conditions as shown in the following table.

| Exposure | Plate | Original | Color filter | CS | Et (sec.) | f (sec.) |
|---|---|---|---|---|---|---|
| 1 | Cyan | Letter B | No. 25 | No | 3.3 | — |
| 2 | " | Photograph | No. 25 | Yes | 25 | 3.7 |
| 3 | Magenta | Letter A | No. 58 | No | 4 | — |
| 4 | " | Photograph | No. 58 | Yes | 30 | 3.6 |
| 5 | Yellow | Letter A | No. 47B | No | 7 | — |
| 6 | " | Letter B | No. 47B | No | 7 | — |
| 7 | " | Photograph | No. 47B | Yes | 50 | 3 |
| 8 | Black | Letter C | No. 85B | No | 3.5 | — |
| 9 | " | Photograph | No. 85B | Yes | 60 | 3 |

Letter original: The exposure section was shielded against light with the adhering sheet pulled out of the carriage; the sensitive material was fed from the magazine; vacuum was applied; and exposed. The exposed sensitive material was wound back into the magazine; the adhering sheet was removed; a gray contact screen (CS; 150 lines/inch) was set in place; and shielded again with the adhering sheet. The sensitive material was fed again from the magazine to the same position as before; vacuum was applied; and again exposed to the photograph original.

Photograph original: The photograph in the original was photographed by main exposure (Et) and flash exposure (f).

The exposure was performed at a stop f=16. The contact screen exployed was GCDN (150 lines/inch) of Dainippon Screen Co. The screen angles were varied as follows: 15° for cyan plate, 45° for magenta plate, 0° for yellow plate, 75° for black plate). In exposing each plate, the non-exposure areas in the original were masked.

After exposure, each plate was cut apart and sent to the developing, stabilizing, and desensitizing tanks where the exposed material was processed to complete the printing plate making.

| Developer: | |
|---|---|
| Water | 700 ml |
| Potassium hydroxide | 20 g |
| Anhydrous sodium sulfite | 50 g |
| 2-Mercaptobenzoic acid | 1.5 g |
| 2-Methylaminoethanol | 15 g |
| Made up with water to | 1 liter |
| Neutralizer: | |
| Water | 600 ml |
| Citric acid | 10 g |
| Sodium citrate | 35 g |
| Colloidal silica (20% suspension) | 5 ml |
| Ethylene glycol | 5 ml |
| Made up with water to | 1 liter |
| Desensitizer: | |
| Water | 600 ml |
| Isopropyl alcohol | 400 ml |
| Ethylene glycol | 50 g |
| 3-Mercapto-4-acetamido-5-n-heptyl-triazole | 1 g |

Each lithographic printing plate was inked with an offset printing ink of the corresponding color and superposed multicolor printing was performed. The reproducibility of the letter original was of course excellent. The color reproducibility of a multicolor original was also excellent, the dot area distribution being in the range of from 5 to 95%. The printing endurance was as high as 30,000 or more in terms of the number of copies obtainable.

For comparison, a magenta plate was made in the same manner as described above, except that the original was halftone dot image (150 lines/inch; 5–95% dot area) formed on a positive sheet of silver complex diffusion transfer process, and neither a contact screen nor flash exposure was used. Printing test was run using the resulting red printing plate (50% dot). The highlight areas (5–20% dot) were not reproduced and no halftone area was observed in the shadow areas. The halftone dot image was disappeared before 20,000 copies had been printed.

What is claimed is:

1. A method for the direct manufacture of printing plates for multicolor lithography, which includes the following steps:
   (1) shielding an exposure section against light by a light shielding means;
   (2) feeding to said exposure section a magazine containing a sensitive material convertible into lithographic printing plate, which material bears a panchromatically sensitized photographic layer;
   (3) bringing said sensitive material into close contact with a contact screen;
   (4) exposing said sensitive material to the reflected light from a continuous gradation multicolor original whereby a yellow plate, a magenta plate and a cyan plate is prepared by carrying out the above steps (1), (2), (3), and (4), there being used a color separation filter for at least blue, green and red at the exposing step and a black plate prepared by carrying out the above steps (1), (2), (3), and (4);
   (5) exposing at least one of said yellow plate, magenta plate, cyan plate, and black plate to the reflected light from a line drawing original without using a contact screen; and
   (6) sending the thus exposed plate to a processing bath section.

2. A method for the direct making of printing plates for multicolor lithography according to claim 1, wherein the sensitive material bears at least a silver halide emulsion layer overlaid with a physical development nuclei layer.

3. A method for the direct making of printing plates for multicolor lithography according to claim 1, wherein the contact screen has a ruling of 133 lines per inch or more.

4. A method for the direct making of printing plates for multicolor lithography according to claim 1, wherein the exposure is performed while the non-exposing area of the original being masked.

5. A method for the direct making of printing plates for multicolor lithography according to claim 1, wherein the exposure platen is disposed nearly horizontally.

6. A method according to claim 1 wherein the sensitive material is exposed to the reflected light through an image reversing mechanism.

7. A method according to claim 1 wherein a light source for transmission exposure is additionally used.

8. A method for printing, comprising employing the printing plate made by the method of claim 1.

* * * * *